United States Patent [19]

Chang et al.

[11] Patent Number: 5,043,299

[45] Date of Patent: Aug. 27, 1991

[54] PROCESS FOR SELECTIVE DEPOSITION OF TUNGSTEN ON SEMICONDUCTOR WAFER

[75] Inventors: Mei Chang, Cupertino; David N. Wang, Saratoga, both of Calif.

[73] Assignee: Applied Materials, Inc., Santa Clara, Calif.

[21] Appl. No.: 444,485

[22] Filed: Dec. 1, 1989

[51] Int. Cl.$^5$ .................. H01L 21/00; H01L 21/02; H01L 21/203; H01L 21/302
[52] U.S. Cl. .................. 437/192; 437/200; 437/225; 437/228; 437/245; 148/DIG. 51; 156/625; 156/646; 118/715; 118/733
[58] Field of Search .............. 437/189, 192, 200, 225, 437/228; 427/38, 39; 148/DIG. 51, DIG. 158; 156/345, 643, 646; 118/50.1, 620; 204/192.12, 192.32

[56] References Cited

U.S. PATENT DOCUMENTS

| | | | |
|---|---|---|---|
| 4,579,609 | 4/1986 | Reif et al. | 437/171 |
| 4,605,479 | 8/1986 | Faith, Jr. | 437/170 |
| 4,786,352 | 11/1988 | Benzing | 204/132 |

OTHER PUBLICATIONS

Wolf, S., Silicon Processing for the VLSI Era, vol. 1, Lattice Press, 1986, pp. 399-404.
Coburn, J., Plasma-Assisted Etching, Plasma Chem. and Plasma Processing, vol. 2, No. 1, 1982, pp. 1-9, 28-29, 36-41.

Primary Examiner—Brian E. Hearn
Assistant Examiner—B. Everhart
Attorney, Agent, or Firm—John P. Taylor

[57] ABSTRACT

An improved process for the selective deposition of tungsten on a masked semiconductor wafer is disclosed which comprises cleaning the surfaces of the wafer in an air-tight cleaning chamber, then transferring the cleaned wafer to a vacuum deposition chamber such as a CVD chamber for selective deposition of tungsten thereon without exposing the cleaned wafer to conditions which would recontaminate the cleaned wafer prior to said deposition, and then selectively depositing tungsten on the unmasked surfaces of the cleaned wafer.

15 Claims, 2 Drawing Sheets

PROCESS FOR SELECTIVE DEPOSITION OF TUNGSTEN ON SEMICONDUCTOR WAFER

BACKGROUND OF THE INVENTION

1. Field of the Invention

This invention relates to the processing of semiconductor wafers. More particularly, this invention relates to improvements in the process of forming a selective coating of tungsten on a semiconductor wafer having a patterned mask thereon.

2. Description of the Related Art

In the processing of semiconductor wafers to selectively deposit tungsten over layers of, for example, aluminum, silicon, tungsten, or titanium nitride, having patterned masks thereon, it is important that the surfaces be free of any contamination, including moisture or any oxides such as, for example, aluminum oxide, silicon oxide, tungsten oxide, and titanium oxide.

Such contamination, if present can either mask or inhibit nucleation on the unmasked areas where the selective tungsten deposit is desired, or may provide unwanted nucleation sites on masked portions of the wafer.

The semiconductor wafer surfaces are, therefore, usually cleaned to remove all contamination and moisture prior to such a selective deposit. Such cleaning includes both the surfaces to be deposited on, as well as the mask surfaces.

Such cleaning is conventionally carried out by wet cleaning, for example, using an HF etch (for oxide removal) or a $H_2SO_4:H_2O_2:H_2O$ cleaning solution (for removal of organics) to remove the contaminants, including oxides, from both the unmasked surfaces as well as the surfaces of the mask.

While such wet cleaning of the masked and unmasked areas of the wafer surface does result in removal of the contaminants, including oxides, from the mask surfaces as well as the unmasked surfaces, moisture is not necessarily removed. More importantly, however, is the subsequent exposure of the cleaned surfaces to ambient conditions during the transfer of the cleaned wafer from the wet cleaning apparatus to a vacuum deposition apparatus suitable for the selective deposition of tungsten on the unmasked areas of the wafer by deposition techniques such as chemical vapor deposition (CVD) or plasma-assisted CVD. Such exposure can interfere with the subsequent tungsten deposition process, including the reproducibility of the results from wafer to wafer.

It would, therefore, be beneficial to provide an improved process for the selective deposition of tungsten on a semiconductor wafer wherein the masked and unmasked surfaces could be cleaned to remove contaminants such as oxides and moisture and the selective tungsten deposition then carried out without intervening exposure of the cleaned surfaces of the wafer to further contamination.

SUMMARY OF THE INVENTION

It is, therefore, an object of this invention to provide an improved process for the selective deposition of tungsten on a masked semiconductor wafer which comprises cleaning the surfaces of the wafer in an air-tight cleaning chamber and then transferring the cleaned wafer to a vacuum deposition chamber for selective deposition of tungsten thereon without exposing the cleaned wafer to conditions which would recontaminate the cleaned wafer prior to the deposition.

It is another object of this invention to provide an improved process for the selective deposition of tungsten on a masked semiconductor wafer which comprises cleaning the surfaces of the wafer in a cleaning chamber under vacuum and then transferring the cleaned wafer from the cleaning chamber to a CVD chamber through a passage between the respective chambers in which the atmosphere is controlled to exclude moisture or oxidizing gases to permit selective tungsten deposition on the clean surfaces on the wafer without exposing the cleaned wafer to conditions which would recontaminate the cleaned wafer prior to the deposition.

It is still another object of this invention to provide an improved process for the selective deposition of tungsten on a masked semiconductor wafer which comprises cleaning the surfaces of the wafer in a cleaning chamber under vacuum using a halogen-containing gas to remove contaminants including oxides and moisture and then transferring the cleaned wafer from the cleaning chamber to a CVD chamber through a passage between the respective chambers maintained under vacuum to exclude moisture or oxidizing gases to permit selective tungsten deposition on the clean surfaces on the wafer without exposing the cleaned wafer to conditions which would recontaminate the cleaned wafer prior to the deposition.

It is yet another object of this invention to provide an improved process for the selective deposition of tungsten on a masked semiconductor wafer which comprises cleaning the surfaces of the wafer in a cleaning chamber under vacuum using a halogen-containing gas and a plasma to remove contaminants including oxides and moisture and then transferring the cleaned wafer from the cleaning chamber to a CVD chamber through an air-tight passageway between the respective chambers in which one or more inert or reducing gases are present and moisture or oxidizing gases are excluded to permit selective tungsten deposition on the clean surfaces on the wafer without exposing the cleaned wafer to conditions which would recontaminate the cleaned wafer prior to the deposition.

These and other objects of the invention will be apparent from the following description and accompanying drawings.

DETAILED DESCRIPTION OF THE INVENTION

Figure 2:
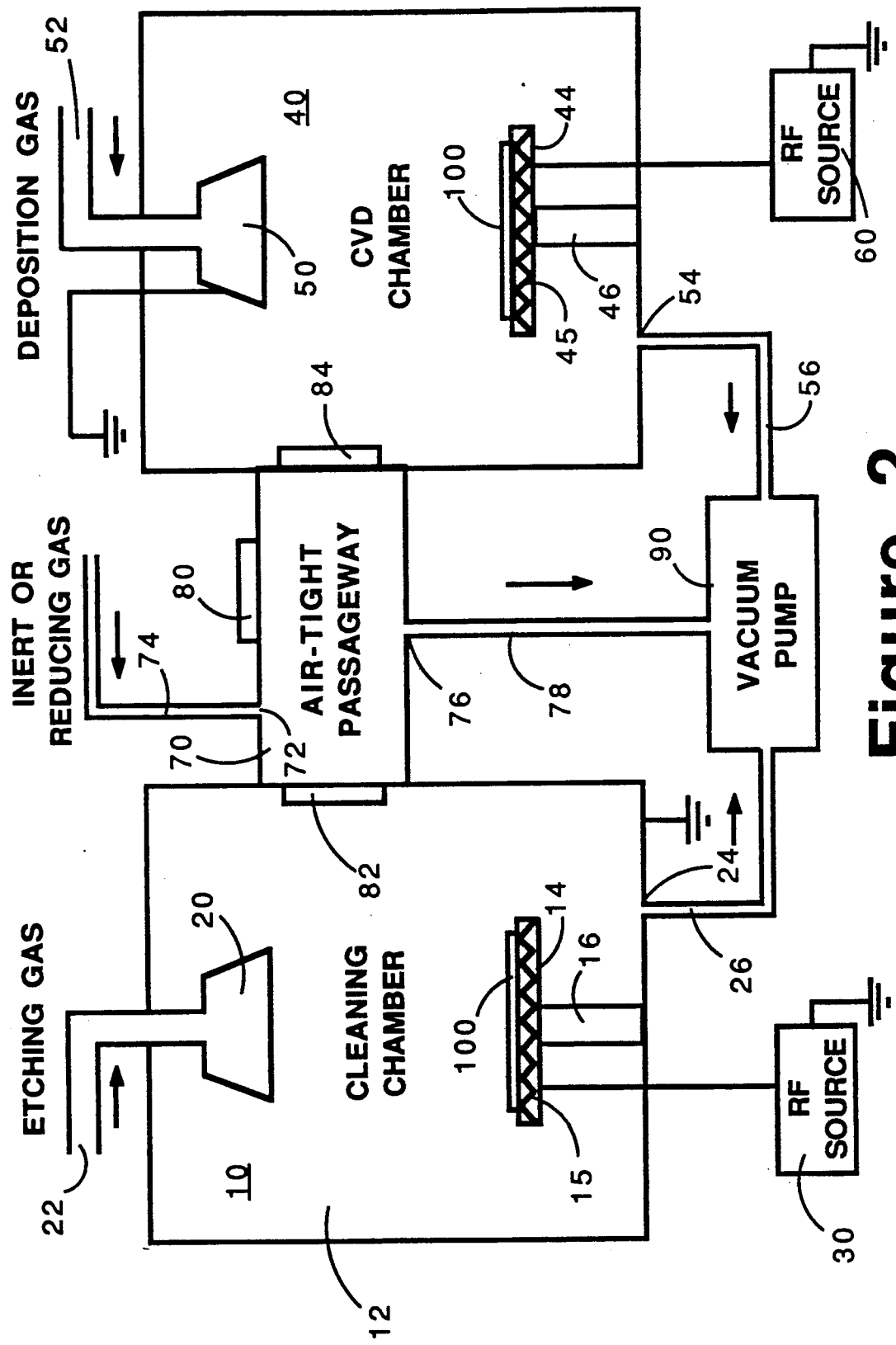
FIG. 2 is a diagrammatic illustration of the relationship between the vacuum cleaning chamber and the CVD chamber for the selective deposition of tungsten showing the transfer passage between the two chambers which permits transfer of the cleaned wafer directly to the vacuum deposition chamber without exposure of the cleaned wafer to ambient conditions.
Figure 1:
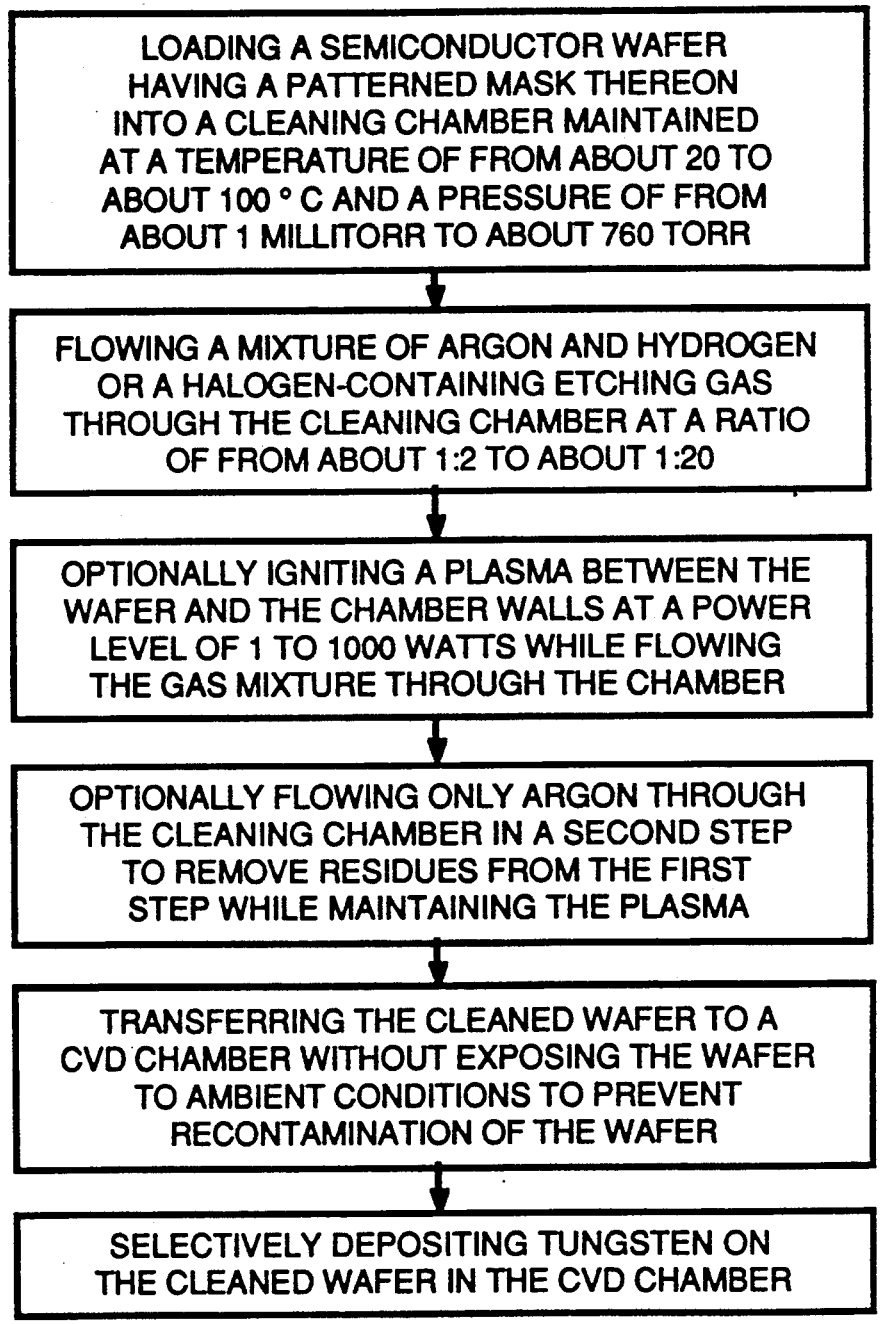
FIG. 1 is a flow sheet illustrating the process of the invention.

Referring now to FIG. 2, an apparatus suitable for the practice of the invention is shown comprising a cleaning chamber 10 and a chemical vapor deposition (CVD) chamber 40 which are interconnected by an air-tight passageway 70 which permits movement of the cleaned wafer from cleaning chamber 10 to CVD chamber 40 without contamination of the cleaned wafer.

Cleaning chamber 10 includes therein a wafer support or base member or cathode 14 which may be supported by a pedestal 16 and on which a semiconductor wafer 100 is placed during the RIE cleaning process. Chamber 10 also includes a gas distribution or "showerhead" member 20 through which an etching or cleaning gas is fed into the chamber through a pipe 22 from a gas source (not shown). Base member 14 and wafer 100 thereon are maintained at a temperature within a range of from about 20° to about 100° C., preferably within a range of from about 20° to about 80° C., during the cleaning step by a heater 15 within cathode 14.

Cleaning gases may be fed into chamber 10 through distribution member 20. Such cleaning gases preferably will be specifically selected for the particular surface to be cleaned. For example, for cleaning aluminum or aluminum oxide surfaces on the wafer, a halogen-containing gas such as $BCl_3$ may be used; while for cleaning silicon surfaces (to remove silicon oxides) $NF_3$ or $SF_6$ may be used. For tungsten, the use of hydrogen (to remove tungsten oxide) is preferred. In each case, the gas may be further diluted with a carrier gas as will be described below. However, at least in the case of hydrogen, the cleaning gas may be used without dilution by a carrier gas.

The cleaning gas is mixed with a carrier gas such as, for example, argon or helium, or a mixture of same, in a ratio of cleaning gas to carrier gas of from about 1:20 to about 20:1, in parts by volume. The cleaning gas is flowed into the cleaning chamber at a rate within a range of from about 5 to 100 standard cubic centimeters per minute (sccm); while the carrier gas is flowed into the cleaning chamber at a rate within a range of from about 5 to 1000 sccm, depending upon pump capacity.

Chamber 10 is further provided with a gas evacuation port 24 through which gas is evacuated from chamber 10 through pipe 26 to a vacuum pump 90 to maintain a pressure in chamber 10 within a range of from as low as about about 1 milliTorr to as high as atmospheric pressures (760 Torr) when no plasma is used. When a plasma is used in connection with the gas, the pressure will preferably range from about 1 to about 500 milliTorr.

While in some instances, the cleaning gas may be used by itself to clean the wafer, the use of a plasma with the cleaning gas will be advantageous, at least in some instances. An rf source 30 is, therefore, connected to base 16 to permit ignition of a plasma between base 16 and grounded walls 12 of chamber 10. When a plasma is used in the cleaning step, the power level of the plasma should be maintained within a range of from about 1 to about 1000 watts, preferably within a range of from about 10 to about 200 watts, and most preferably within a range of from about 10 to about 100 watts.

For the cleaning of aluminum surfaces, the use of reactive ion etching (RIE) may be preferred using the aforesaid mixture of argon and $BCl_3$ gases.

Wafer 100 may be admitted into the apparatus through a first slit valve 80 in passageway 70 from which it may be placed in RIE chamber 10 through a second slit valve 82 located between RIE chamber 10 and passageway 70. Another slit valve 84 provides communication between passageway 70 and CVD chamber 40. Further details of such slit valves, as well as other aspects of the vacuum apparatus, may be found in Toshima U.S. Pat. No. 4,785,962, assigned to the assignee of this invention and cross-reference to which is hereby made.

An exit or evacuation port 76 connects passageway 70 with vacuum pump 90 via pipe 78 to permit maintaining a pressure in said passageway within a range of from about $10^{-2}$ to about $10^{-5}$ milliTorr, practically from about $10^{-2}$ to about $10^{-3}$ milliTorr. Higher pressures may be used, for example, by introducing a non-oxidizing gas into passageway 70 as long as the partial pressure of any impurities in the gas does not exceed about $10^{-2}$ milliTorr.

For this purpose, passageway 70 may also be provided with an entrance port 74 through which one or more non-oxidizing gases, i.e., inert or reducing gases, such as, for example, helium, argon, nitrogen, or hydrogen, or mixtures of same, may be flowed into passageway 70 via pipe 76 from a gas source (not shown).

The amount of flow of such non-oxidizing gases into passageway 70 is not crucial, since the purpose is merely to prevent exposure of the cleaned wafer and mask surfaces to moisture and/or other oxidizing atmospheres prior to admission or passage of wafer 100 into CVD chamber 40. Usually a flow rate of at least about 20 sccm, preferably about 100 sccm, will suffice.

After wafer 100 is placed on base member 14 and brought to the desired temperature, the cleaning gases are flowed into chamber 10 and the plasma ignited, when a plasma is used. The cleaning step should be carried out for a time period within a range of from about 5 to about 300 seconds, preferably from about 20 to about 300 seconds. Longer periods may be used, but may not be needed or be economically feasible.

After the cleaning step is completed, a non-reactive gas such as, for example, a carrier gas, e.g., argon, or a reducing gas such as hydrogen, may be optionally flowed through chamber 10 (without the cleaning gas) for an additional 5 to 30 seconds (or longer) at a rate within a range of from about 5 to about 1000 sccm (preferably about 20 to about 100 sccm when low pressures, i.e., 500 millitorr or lower, are used in the cleaning step) to flush out any residues remaining in chamber 10 from the cleaning step. If a plasma has been used during the cleaning step, it may be left on during this step to assist in removal of any residues remaining in cleaning chamber 10.

After the cleaning and optional flushing steps are completed, wafer 100 is removed from chamber 10 back into passageway 70 via slit valve 82. Wafer 100 is then directly admitted into CVD chamber 40 through slit valve 84 so that, in accordance with the invention, wafer 100 is not exposed to moisture or oxidation or any other contaminants between the cleaning step in cleaning chamber 10 and the tungsten deposition step in CVD chamber 40.

It should be noted that for best results, prior to moving the cleaned wafer into the chamber, the CVD chamber should be cleaned to remove any tungsten residues remaining therein from previous depositions. The CVD chamber, and in particular the susceptor, may be cleaned using an $NF_3$ plasma followed by an $H_2$ plasma. Details of such a cleaning process may be found in Chang U.S. patent application Ser. No. 398,689, assigned to the assignee of this invention and cross-reference to which is hereby made.

CVD chamber 40 may comprise any conventional CVD apparatus. For example, while CVD chamber 40 is depicted in FIG. 2 as a rectangular chamber, it may comprise a cylindrical tube such as the quartz tube CVD chamber described in Miller U.S. Pat. No.

4,794,019, assigned to the assignee of this invention and cross-reference to which is hereby made.

Wafer 100 may be placed on a base or susceptor 44 which may be supported in chamber 40 by a pedestal 46. A mixture of a tungsten-containing gas such as, for example, $WF_6$, and a reducing gas such as $H_2$ or $SiH_4$, is flowed into chamber 40 via pipe 52 and showerhead 50 at a rate within a range of from about 20 to about 200 sccm. When the reducing gas is hydrogen, the $WF_6:H_2$ ratio should range from about 1:50 to about 1:1000 in parts by volume. When the reducing gas is $SiH_4$, the ratio of $WF_6$ to $SiH_4$ should range from about 10:1 to about 1:1.5, in parts by volume. The mixture of tungsten-containing gas and reducing gas may be accompanied by a carrier gas, such as helium or argon, flowing at a rate within a range of from about 1000 to 3000 sccm.

CVD chamber 40 is also provided with an exit port 54 which is connected to vacuum pump 90 to maintain a pressure in CVD chamber 40 during the deposition within a range of from about 1 milliTorr to about 760 Torr, preferably from about 1 milliTorr up to about 200 milliTorr.

During the subsequent selective tungsten CVD process, the wafer and base or susceptor 44 on which it rests may be maintained at a temperature within a range of from about 350° to about 500° C., when using $H_2$ as the reducing gas, and and within a range of from about 200° to about 400° C., when using $SiH_4$ as the reducing gas, by a heater 45 mounted within base 44.

The selective tungsten deposition is then carried out in CVD chamber 40 for an amount of time sufficient to deposit the desired thickness of tungsten on the exposed surfaces of wafer 100.

The following examples will serve to further illustrate the improved tungsten deposition process of the invention.

EXAMPLE I

Several patterned silicon wafers, having silicon dioxide masks and different thicknesses of native oxide on exposed silicon surfaces, were processing by inserting each sequentially into the plasma etching chamber of an Applied Materials Series 5000 Apparatus and placing the respective wafer on a support base therein. Each wafer and the support base were heated to a temperature of 30° C. A mixture of argon and $NF_3$ in a ratio of 5:1 were flowed into the chamber at a rate of 60 sccm. The chamber was maintained at a pressure of 10 milliTorr. A plasma of 15 watts was ignited and maintained in the chamber for a period of 1 minute after which the plasma was extinguished and the flow of $NF_3$ shut off. Argon gas was then allowed to flow through the chamber of an additional 10 seconds to remove any residues remaining in the chamber from the cleaning process.

The cleaned wafer was then moved from the plasma etch cleaning chamber through an air-tight passageway, through which argon was flowing at a rate of 10 sccm, into a previously cleaned CVD chamber where it was placed on a susceptor.

A 1 micron layer of CVD tungsten was then selectively deposited over the exposed silicon portions on the cleaned patterned wafer. The temperature of the wafer and the susceptor during the deposition was maintained at about 300° C. During the deposition $WF_6$ gas was flowed into the chamber at about 10 sccm, $SiH_6$ was flowed into the CVD chamber at about 7 sccm, and about 100 sccm of argon was also flowed into the chamber. A pressure of about 80 milliTorr was maintained in the chamber during the deposition. The deposition was carried out for a period of about 2 minutes to provide the 1 micron selective layer of tungsten on the unmasked portions of the wafer.

After the selective deposition of tungsten on each of the masked wafers was completed, each wafer was removed from the CVD chamber. The wafers were sectioned and examined under a scanning electron microscope (SEM) to measure the thickness of the deposited coatings, the surface roughness, and the selectivity of the deposition. The thickness of the coating on the various wafers was found to be substantially uniform with less than 10% variance in thickness from one wafer to another as well as across the surface of any particular wafer. The surface of the deposited tungsten appeared to be smooth on each wafer, and little, if any, evidence of tungsten deposition on the non-silicon surfaces was noted.

EXAMPLE II

Several patterned silicon wafers, having exposed aluminum surfaces, were first cleaned in the same manner as were the wafers in Example I, except that $BCl_3$ was used as the cleaning gas and the power level of the plasma was raised to 50 watts.

As in Example I, the cleaned wafer was then moved from the plasma etch cleaning chamber through an air-tight passageway, through which argon was flowing at a rate of 10 sccm, into the previously cleaned CVD chamber.

A 1 micron layer of CVD tungsten was then selectively deposited over the exposed aluminum portions on the cleanl micron layer of CVD tungsten was then selectively deposited over the exposed aluminum portions on the cleaned patterned wafer using the same tungsten deposition conditions as in Example I.

After the selective deposition of tungsten on each of the masked wafers was completed, each wafer was removed from the CVD chamber. The wafers were sectioned and examined under a 400X optical microscope. The thickness of the tungsten coating on the various wafers was again found to be substantially uniform. The surface of the tungsten deposited over the cleaned aluminum surfaces appeared to be smooth on each wafer, and no tungsten depositions on the oxide mask surfaces of the wafer were evident.

Thus, the invention provides an improved process for the selective deposition of tungsten reproducibly on masked semiconductor wafers by cleaning each wafer in a cleaning chamber, such as, for example, a plasma etching or an RIE chamber, to remove contaminants, including moisture, from the surface of the wafer, as well as the mask surface, then transferring the cleaned wafer to a CVD chamber without reexposing the cleaned wafer to contaminants by passing the cleaned wafer from the cleaning chamber to the CVD chamber through an air-tight passageway between the two chambers, and then selectively depositing the tungsten on the wafer in the CVD chamber using a tungsten-containing gas and a reducing gas.

Having thus described the invention, what is claimed is:

1. An improved process for the selective deposition of tungsten on a masked semiconductor wafer in a vacuum apparatus comprising a vacuum cleaning chamber connected through an air-tight passageway to a CVD chamber which comprises:

a) cleaning the surfaces of the wafer in said vacuum cleaning chamber while maintaining said chamber at a pressure within a range of from about 1 milliTorr to about 500 milliTorr, by flowing one or more cleaning gases selected from the group consisting of $H_2$ and a halogen-containing gas into said chamber for a period of from about 5 to bout 300 seconds, while using a plasma within a power range of from about 1 to about 200 watts, and while maintaining said wafer at a temperature within a range of from about 20° to about 80° C.;

b) cleaning said CVD chamber prior to transfer of said cleaned wafer thereto by using an $NF_3$ plasma followed by an $H_2$ plasma to remove any tungsten residues from prior depositions;

c) transferring said cleaned wafer from said cleaning chamber to said CVD chamber through an air-tight passageway between said respective chambers in which one or more non-oxidizing gases selected from the group consisting of argon, helium, nitrogen, and hydrogen and mixtures thereof are present to exclude moisture or oxidizing gases to thereby permit subsequent selective tungsten deposition on the clean surfaces on the wafer without exposing the cleaned wafer to conditions which would recontaminate the cleaned wafer prior to said selective deposition; and d) selectively depositing a CVD layer of tungsten on the unmasked surfaces of the wafer by flowing a tungsten-containing gas and a reducing gas through said CVD chamber.

2. The process of claim 1 including the additional step of flowing a non-reactive gas selected from the group consisting of helium and argon through said cleaning chamber for a period of at least about 5 seconds after shutoff of the flow of said cleaning gas into said chamber to remove any residues remaining from said cleaning step.

3. An improved process for the selective deposition of tungsten on a masked semiconductor wafer which comprises:

a) cleaning the surfaces of said wafer in a cleaning chamber under vacuum by the steps of:
  i) inserting said wafer into a cleaning chamber maintained at a pressure within a range of from about 1 to about 500 milliTorr;
  ii) heating said wafer to a temperature within a range of from about 20° to about 80° C.;
  iii) flowing into said chamber for from about 20 to about 300 seconds, a gas mixture comprising a cleaning gas selected from the class consisting of $H_2$, $BCl_3$, $SF_6$, and $NF_3$;
  iv) igniting a plasma in said chamber within a power range of from about 20 to about 100 watts while said gas mixture containing said cleaning gas is flowing into said chamber; and
  v) then flowing a non-reactive gas through said chamber, while maintaining said plasma in said chamber, for at least 5 seconds after flow of said cleaning gas into said chamber is shut off to remove residues from said chamber;

b) transferring the cleaned wafer from said cleaning chamber to a CVD chamber through an air-tight passageway between said respective chambers in which one or more non-oxidizing gases are flowing to exclude moisture or oxidizing gases from said passageway to thereby permit subsequent selective tungsten deposition on the clean surfaces on the wafer without exposing the cleaned wafer to conditions which would recontaminate the cleaned wafer prior to said selective deposition; and c) selectively depositing a CVD layer of tungsten on the unmasked surfaces of said cleaned wafer by exposing said surfaces to a mixture of $WF_6$ and a reducing gas selected from the class consisting of $H_2$ and $SiH_4$.

4. The process of claim 3 wherein said step of flowing one or more non-oxidizing gases through said air-tight passageway comprises flowing said one or more gases selected from the group consisting of argon, helium, nitrogen, hydrogen, and mixtures of same through said passageway at a rate of at least about 100 sccm, while maintaining the pressure in said air-tight passageway within a range of from about $10^{-2}$ to about $10^{-3}$ milliTorr.

5. The process of claim 3 including the further step of flowing one or more non-oxidizing gases through said passageway at a rate of at least about 20 sccm.

6. The process of claim 5 wherein said step of flowing one or more non-oxidizing gases through said passageway further comprises flowing a non-oxidizing gas selected from the class consisting of argon, helium, nitrogen, hydrogen, and mixtures of same.

7. The process of claim 5 wherein said step of flowing one or more non-oxidizing gases through said passageway further comprises maintaining a partial pressure of impurities in said non-oxidizing gas at $10^{-2}$ milliTorr or less.

8. The process of claim 3 wherein said cleaning step further comprises cleaning the surfaces of said wafer in said cleaning chamber using a gaseous mixture which includes hydrogen gas to remove contaminants including oxides and moisture from the surfaces of said wafer.

9. The process of claim 1 which further comprises maintaining a plasma within said cleaning chamber within a range of from about 1 to about 100 watts during said cleaning step.

10. The process of claim 1 including the further step of flowing one or more non-oxidizing gases through said air-tight passageway at a rate of at least about 20 sccm.

11. The process of claim 1 which further comprises maintaining a plasma within said cleaning chamber within a range of from about 1 to about 200 watts during said cleaning step.

12. The process of claim 1 wherein said cleaning gas is selected from the class consisting of hydrogen and a halogen-containing gas.

13. The process of claim 1 wherein said step of selectively depositing said tungsten further comprises flowing into said CVD chamber $WF_6$ and a reducing gas selected from the class consisting of $H_2$ and $SiH_4$.

14. An improved process for the selective deposition of tungsten on a masked semiconductor wafer in a vacuum apparatus comprising a vacuum cleaning chamber connected through an air-tight passageway to a CVD chamber which comprises:

a) cleaning the surfaces of the wafer in said vacuum cleaning chamber while maintaining said chamber at a pressure within a range of from about 1 milliTorr to about 500 milliTorr, by flowing one or more cleaning gases selected from the group consisting of $H_2$ and a halogen-containing gas into said chamber for a period of from about 5 to about 300 seconds, while using a plasma within a power range of from about 1 to about 200 watts, and while maintaining said wafer at a temperature within a range of from about 20° to about 80° C.;

b) cleaning said CVD chamber prior to transfer of said cleaned wafer thereto by using an NF$_3$ plasma followed by an H$_2$ plasma to remove any tungsten residues from prior depositions;

c) transferring said cleaned wafer from said cleaning chamber to said CVD chamber through an airtight passageway between said respective chambers maintained at a vacuum of from about $10^{-2}$ to about $10^{-5}$ milliTorr to exclude moisture or oxidizing gases to thereby permit subsequent selective tungsten deposition on the clean surfaces on the wafer without exposing the cleaned wafer to conditions which would recontaminate the cleaned wafer prior to said selective deposition; and d) selectively depositing a CVD layer of tungsten on the unmasked surfaces of the wafer by flowing a tungsten-containing gas and a reducing gas through said CVD chamber.

15. An improved process for the selective deposition of tungsten on a masked semiconductor wafer which comprises:

a) cleaning the surfaces of said wafer in a cleaning chamber under vacuum by the steps of:

i) inserting said wafer into a cleaning chamber maintained at a pressure within a range of from about 1 to about 500 milliTorr;

ii) heating said wafer to a temperature within a range of from about 20° to about 80° C.;

iii) flowing into said chamber for from about 20 to about 300 seconds, a gas mixture comprising a cleaning gas selected from the class consisting of H$_2$, BCl$_3$, SF$_6$, and NF$_3$;

iv) igniting a plasma in said chamber within a power range of from about 20 to about 100 watts while said gas mixture containing said cleaning gas is flowing into said chamber; and v) then flowing a non-reactive gas selected from the group consisting of helium and argon through said chamber, while maintaining said plasma in said chamber, for at least 5 seconds after flow of said cleaning gas into said chamber is shut off to remove residues from said chamber;

b) transferring the cleaned wafer from said cleaning chamber to a CVD chamber through an air-tight passageway between said respective chambers maintained at a vacuum of from about $10^{-2}$ to about $10^{-5}$ milliTorr to therefore exclude moisture or oxidizing gases from contacting said cleaned wafer in said passageway to thereby permit subsequent selective tungsten deposition on the clean surfaces on the wafer without exposing the cleaned wafer to conditions which would recontaminate the cleaned wafer prior to said selective deposition; and c) selectively depositing a CVD layer of tungsten on the unmasked surfaces of said cleaned wafer by exposing said surfaces to a mixture of WF$_6$ and a reducing gas selected from the group consisting of H$_2$ and SiH$_4$.

* * * * *

REEXAMINATION CERTIFICATE (3136th)

United States Patent [19]
Chang et al.

[11] B1 5,043,299
[45] Certificate Issued Feb. 25, 1997

[54] PROCESS FOR SELECTIVE DEPOSITION OF TUNGSTEN ON SEMICONDUCTOR WAFER

[75] Inventors: Mei Chang, Cupertino; David N. Wang, Saratoga, both of Calif.

[73] Assignee: Applied Materials, Inc., Santa Clara, Calif.

Reexamination Request:
No. 90/004,070, Nov. 17, 1995

Reexamination Certificate for:
Patent No.: 5,043,299
Issued: Aug. 27, 1991
Appl. No.: 444,485
Filed: Dec. 1, 1989

[51] Int. Cl.[6] .......................... H01L 21/00; H01L 21/02; H01L 21/203; H01L 21/302
[52] U.S. Cl. .......................... 437/192; 437/200; 437/225; 437/228; 437/245; 148/DIG. 51; 118/715; 118/733; 156/625; 156/646
[58] Field of Search .......................... 437/189, 192, 437/200, 225, 228; 148/DIG. 51, DIG. 158; 156/345, 643, 646; 118/56.1, 620; 204/191.12, 192.32

[56] References Cited

U.S. PATENT DOCUMENTS

| | | | |
|---|---|---|---|
| 4,579,609 | 4/1986 | Reif et al. | 148/175 |
| 4,585,517 | 4/1986 | Stemple | 156/643 |
| 4,605,479 | 8/1986 | Faith, Jr. | 204/192 |
| 4,785,962 | 11/1988 | Toshima | 220/260 |
| 4,786,352 | 11/1988 | Benzing | 156/345 |
| 4,847,111 | 7/1989 | Chow et al. | 427/38 |
| 4,951,601 | 8/1990 | Maydan et al. | 118/719 |
| 4,985,372 | 1/1991 | Narita | 437/192 |

FOREIGN PATENT DOCUMENTS

| | | | |
|---|---|---|---|
| 0157052 | 10/1985 | European Pat. Off. | H01L 23/52 |
| 0272141 | 6/1988 | European Pat. Off. | H01L 21/00 |
| 63-081915 | 9/1986 | Japan | H01L 21/205 |
| 62-12129 | 1/1987 | Japan | H01L 21/302 |
| 63-220515 | 3/1987 | Japan | H01L 21/205 |
| 63-267430 | 4/1987 | Japan | B01J 19/08 |
| 1-176293 | 9/1987 | Japan | C30B 25/02 |
| 1-108723 | 10/1987 | Japan | H01L 21/285 |
| 1-152274 | 12/1987 | Japan | C23C 16/44 |
| 63-241171 | 12/1987 | Japan | C23C 16/44 |
| 2181297 | 4/1987 | United Kingdom | H01L 21/467 |

OTHER PUBLICATIONS

Coburn, J. W., "Plasma–Assisted Etching", *Plasma Chemistry and Plasma Processing*, vol. 2, No. 1, 1982, pp. 1–9, 28–29, 36–39.

Wolf, Stanley, et al., *Silicon Processing for the VLSI Era*, vol. 1: *Process Technology*, Sunset Beach, CA: Lattice Press, 1986, pp. 399–404.

*Primary Examiner*—Robert M. Kincaid

[57] ABSTRACT

An improved process for the selective deposition of tungsten on a masked semiconductor wafer is disclosed which comprises cleaning the surfaces of the wafer in an air-tight cleaning chamber, then transferring the cleaned wafer to a vacuum deposition chamber such as a CVD chamber for selective deposition of tungsten thereon without exposing the cleaned wafer to conditions which would recontaminate the cleaned wafer prior to said deposition, and then selectively depositing tungsten on the unmasked surfaces of the cleaned wafer.

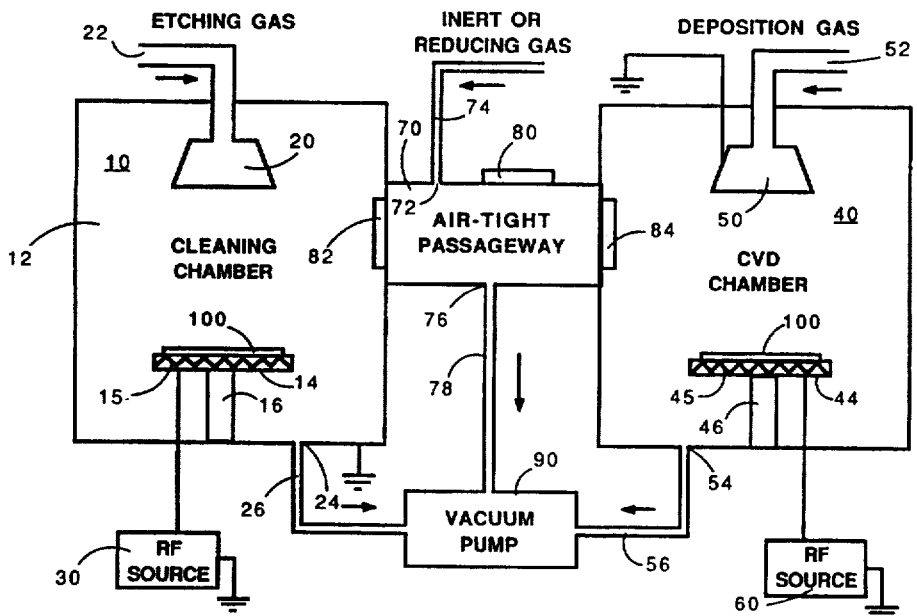

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1 to 15 is confirmed.

New claims 16 to 19 are added and determined to be patentable.

*16. The process of claim 1 wherein the step of transferring said cleaned wafer includes introducing the one or more non-oxidizing gases to the air-tight passageway through an entrance port separately attached to the air-tight passageway.*

*17. The process of claim 3 wherein the step of transferring the cleaned wafer includes introducing the one or more non-oxidizing gases to the air-tight passageway through an entrance port separately attached to the air-tight passageway.*

*18. The process of claim 14 wherein the step of transferring said cleaned wafer includes introducing a non-oxidizing gas to the air-tight passageway through an entrance port separately attached to the air-tight passageway.*

*19. The process of claim 15 wherein the step of transferring the cleaned wafer includes introducing a non-oxidizing gas to the air-tight passageway through an entrance port separately attached to the air-tight passageway.*

\* \* \* \* \*